United States Patent [19]
Ballance et al.

[11] Patent Number: 6,090,210
[45] Date of Patent: *Jul. 18, 2000

[54] MULTI-ZONE GAS FLOW CONTROL IN A PROCESS CHAMBER

[75] Inventors: David S. Ballance, Cupertino; Benjamin Bierman, Milpitas; James V. Tietz, Fremont, all of Calif.

[73] Assignee: Applied Materials, Inc., Santa Clara, Calif.

[*] Notice: This patent is subject to a terminal disclaimer.

[21] Appl. No.: 08/690,265

[22] Filed: Jul. 24, 1996

[51] Int. Cl.⁷ .............................. C23C 16/00; F27B 5/04; F27B 5/16
[52] U.S. Cl. .......................... 118/725; 118/715; 118/724; 118/50.1; 392/416; 392/418; 219/390; 219/405; 219/411; 239/450; 239/555; 239/558; 239/589; 239/596
[58] Field of Search .................................... 118/715, 724, 118/725, 50.1; 392/416, 418; 219/390, 405, 411; 432/77; 239/548, 553, 553.5, 555, 450, 557, 558, 568, 596, 589

[56] References Cited

U.S. PATENT DOCUMENTS

| | | | |
|---|---|---|---|
| 3,381,114 | 4/1968 | Nakanuma | 219/385 |
| 3,854,443 | 12/1974 | Baerg | 118/724 |
| 4,880,163 | 11/1989 | Kobayashi et al. | 239/422 |
| 5,094,013 | 3/1992 | Martin et al. | 34/62 |
| 5,155,336 | 10/1992 | Gronet et al. | 219/411 |
| 5,156,820 | 10/1992 | Wong et al. | 422/186.05 |
| 5,453,124 | 9/1995 | Moslehi et al. | 118/715 |
| 5,500,256 | 3/1996 | Watabe | 427/256 |
| 5,516,722 | 5/1996 | Kim | 117/102 |
| 5,532,190 | 7/1996 | Goodyear et al. | 118/715 |
| 5,624,498 | 4/1997 | Lee et al. | 118/715 |
| 5,653,806 | 8/1997 | Van Buskirk | 118/715 |
| 5,660,472 | 8/1997 | Peuse et al. | 374/128 |
| 5,781,693 | 7/1998 | Ballance et al. | 392/416 |
| 5,824,158 | 10/1998 | Takeuchi et al. | 118/723 IR |
| 5,871,586 | 2/1999 | Crawley et al. | 118/715 |

FOREIGN PATENT DOCUMENTS

| | | |
|---|---|---|
| 0454054 A2 | 10/1991 | European Pat. Off. . |
| 0 502 209 | 9/1992 | European Pat. Off. . |
| 687749 | 12/1995 | European Pat. Off. . |
| 59-4434 | 1/1984 | Japan . |
| 60-189928 | 9/1985 | Japan . |
| 61-5515 | 1/1986 | Japan . |
| 63-53932 | 3/1988 | Japan . |
| 2-200784 | 8/1990 | Japan . |
| 2-234419 | 9/1990 | Japan . |
| 3-170675 | 7/1991 | Japan . |
| 3-281780 | 12/1991 | Japan . |
| 598630 | 2/1978 | U.S.S.R. . |
| WO 9014158 | 11/1990 | WIPO . |
| WO 9015172 | 12/1990 | WIPO . |

OTHER PUBLICATIONS

Copy of European Search Report dated Nov. 11, 1997.

*Primary Examiner*—Jeffrie R Lund
*Attorney, Agent, or Firm*—Fish & Richardson

[57] ABSTRACT

A showerhead for introducing gas from one or more external supplies into a substrate processing chamber, the showerhead including a faceplate including a plurality of gas injection ports through which gas is injected into the chamber, wherein the plurality of gas injection ports includes a first subset of gas injection ports and a second subset of gas injection ports; a first gas distribution system which during use delivers a first gas to the first subset of injection ports for injection into the chamber; and a second gas distribution system which during use delivers a second gas to the second subset of injection ports for injection into the chamber.

16 Claims, 8 Drawing Sheets

MULTI-ZONE GAS FLOW CONTROL IN A PROCESS CHAMBER

BACKGROUND OF THE INVENTION

The invention relates generally to gas distribution in processing chambers, such as RTP chambers.

Typically, rapid thermal processing systems utilize a high intensity light source to rapidly heat a substrate that is held within a processing chamber, sometimes under vacuum conditions. The light source, which may consist of an array of high intensity lamps, is located outside of the chamber and adjacent to a window through which the light passes into the chamber. Inside of the chamber and on the other side of the window, the substrate is supported in such a manner that it can be heated by the incoming light. In some systems, the substrate is supported on a susceptor and it is the susceptor that is directly heated by the light. In other systems, the substrate is supported by a support ring which leaves both the front and back of the wafer substantially exposed to the atmosphere in the chamber and it is the frontside of the substrate which is directly heated by the light. The wavelength of the light is selected so that it is substantially absorbed by the substrate or the system component that is being heated and the material of which the window is made is selected so that it is substantially transparent to the light. Often, quartz is used for the window.

Two systems which utilize support rings are described in greater detail in U.S. Pat. No. 5,155,336 and in U.S. Pat. No. 5,660,472, both of which are incorporated herein by reference.

For many processes that are performed within the chamber (e.g. deposition, etch, epitaxial processes, doping, growing oxides, nitridation, etc.), it is necessary to deliver a process gas into the chamber. Moreover, the process gas must be delivered so as to produce substantially uniform results over the surface of the wafer. One approach that has been used is to inject the gas to the side of the substrate and let it flow over the surface of the substrate (see U.S. Pat. No. 5,155,336 referenced above). Another approach has been to use a showerhead that is positioned adjacent to the substrate and on the side of the substrate that is opposite the side that is being heated by the high intensity light (see U.S. Pat. No. 5,660,472 also referenced above). Though these and other various approaches to gas injection do exist, there is always a need to improve upon them.

SUMMARY OF THE INVENTION

In general, in one aspect, the invention is a showerhead for introducing gas from one or more external supplies into a substrate processing chamber. The showerhead includes a faceplate including a plurality of gas injection ports through which gas is injected into the chamber, wherein the plurality of gas injection ports includes a first subset of gas injection ports and a second subset of gas injection ports. The invention also includes a first gas distribution system which during use delivers a first gas to the first subset of injection ports for injection into the chamber; and a second gas distribution system which during use delivers a second gas to the second subset of injection ports for injection into the chamber.

Preferred embodiments include the following features. The showerhead also includes a plenum chamber formed behind the faceplate and which receives gas from the one or more external supplies. The plenum chamber is divided into a plurality of internal chambers isolated from each other and including a first internal chamber and a second internal chamber; and a first and a second gas inlet. The first inlet is coupled to the first chamber and the second inlet is coupled to the second chamber. The showerhead, which is used with a lamp head to heat the substrate to a process temperature, also includes a top window on a side of the showerhead that is adjacent to the lamp head; and a bottom window on a side of the showerhead that is adjacent to the substrate during processing. The top and bottom windows define a cavity therebetween and are transparent to the radiation from the source in the lamp head and the bottom window functions as the faceplate.

Also in preferred embodiments, the plurality of injection ports are a plurality of holes through the bottom window. In addition, the showerhead further includes a top plate with a plurality of holes; a bottom plate with a plurality of holes equal in number to the plurality of holes in the top plate; and a plurality of tubes equal in number to the plurality of holes in the top plate. Each of the plurality of tubes connects a different one of the holes in the top plate to a corresponding one of the holes in the bottom plate; and the top window is adjacent to the top plate and the bottom window is adjacent to the bottom plate. At least one of the top and bottom plates has a first array of channels formed therein for distributing gas to the first subset of injection ports, and at least one of the top and bottom plates has a second array of channels formed therein for distributing gas to the second set of injection ports.

In general, in another aspect, the invention is a thermal processing system including a chamber defining a processing cavity; a lamp head; a showerhead positioned between the lamp head and the processing cavity in the chamber; and a substrate support mechanism within the chamber and spaced apart from the adapter plate. The showerhead is constructed as described above.

In general, in yet another aspect, the invention is a showerhead for introducing gas from one or more external supplies into a substrate processing chamber. The showerhead includes a faceplate including a plurality of gas injection ports through which gas is injected into the chamber, wherein the plurality of gas injection ports includes a plurality of subsets of gas injection ports; and it includes a plurality of gas distribution systems equal in number to the plurality of subsets of gas distribution ports. Each of the gas distribution systems is connected to a different subset of gas injection ports and during use, it delivers a corresponding gas to the subset to which it is connected for injection into the chamber.

As wafer diameters increase to 300 mm and above, conventional showerhead gas distributors may prove to be insufficient for producing uniformly deposited films. A multi-zone showerhead design will provide flow control zones which may be used to adjust gas flow to offset gas depletion and/or boundary layer effects which will tend to be a greater problem in the larger systems. In addition, this method of flow control is readily scalable to even larger wafer diameters.

The invention provides individual control of multiple zones of gas distribution holes in a gas showerhead. This enables one to alter the flow of process gas where local film non-uniformities occur and to thereby reduce the non-uniformities.

In some systems, there is a tendency for the sizes of the gas distribution holes to become larger as the system the longer the system has been in use. This is because the center of the showerhead often tends to be hotter than the perimeter of the showerhead. Thus, when a quartz showerhead is cleaned or etched to remove materials that have deposited on it during previous process runs, the inner holes in the hotter portion of the head are likely to etch more than the holes in the cooler portion of the head, thereby producing larger holes near the center. This affects the distribution of gas flowing over the surface of the substrate during processing and thus detrimentally impacts the uniformity of the film that is being deposited or the etch that is being performed. Eventually, the showerhead will have to be discarded and replaced with a new showerhead. However, with a dual zone showerhead (or a multi-zone showerhead) it will be possible to reduce the pressure of the gas supplied to the center holes as compared to the outer holes and thereby compensate for their larger size. Thus, the life of the showerhead can be extended.

Other advantages and features will become apparent from the following description of the preferred embodiment and from the claims.

DESCRIPTION OF THE PREFERRED EMBODIMENTS

Figure 1:
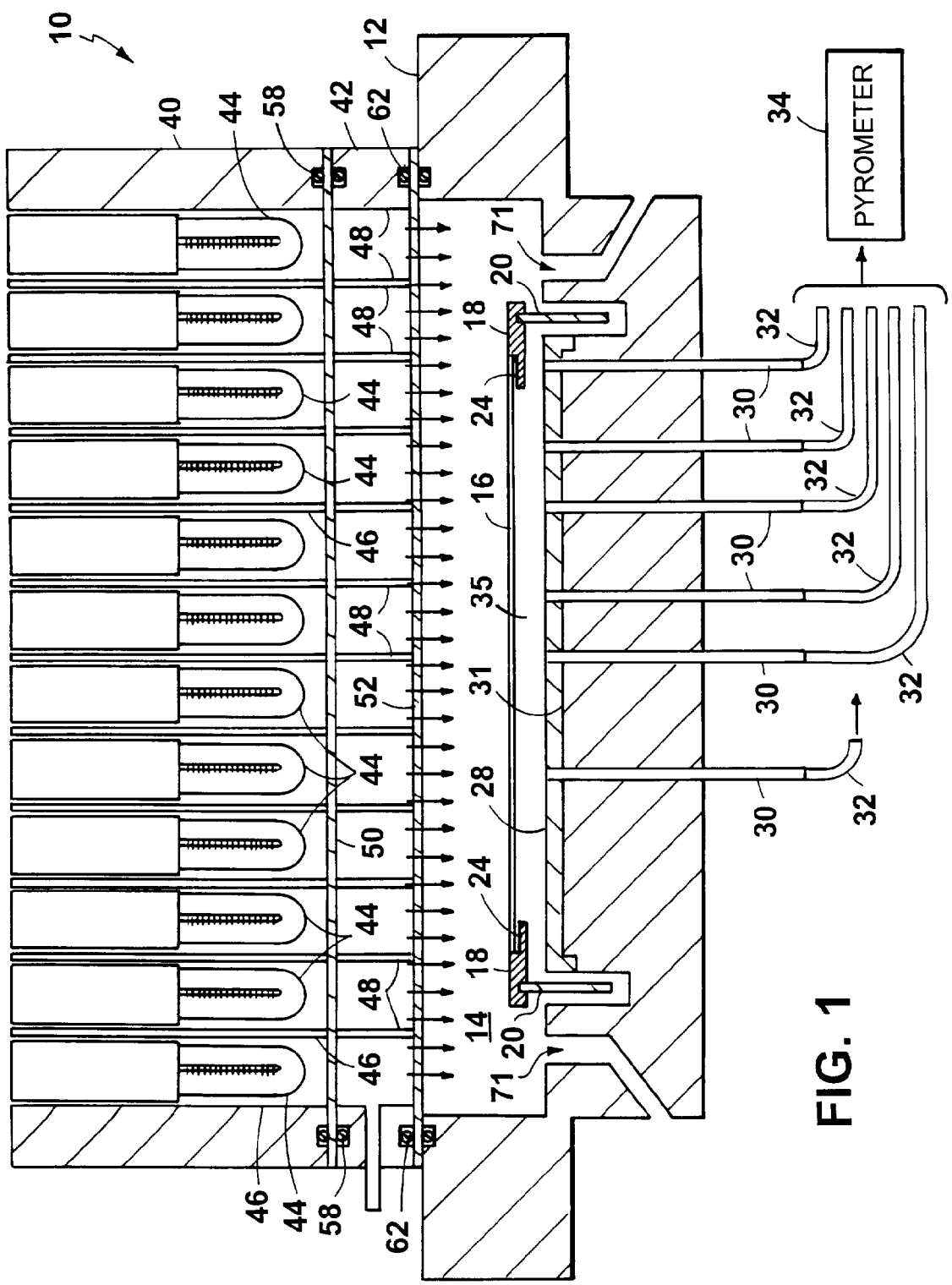
FIG. 1 is a schematic representation of an RTP chamber.

Referring to FIG. 1, a representative RTP chamber 10 includes a chamber body 12 which defines an internal processing cavity 14 in which a substrate 16 is held during processing. The substrate is typically a semiconductor wafer (e.g. silicon) although it could be made of other materials and could have shapes other than wafer form. For example, the substrate could be a glass plate such as is used to fabricate display screens.

At the top of the chamber there is a heat source which is used to irradiate substrate 16 with a high intensity radiation (e.g. light) and thereby rapidly heat substrate 16 to the desired processing temperature. The heat source includes a lamp head 40 and an adapter plate 42 which functions as an interface between lamp head 40 and chamber body 12. Lamp head 40 contains an array of tungsten-halogen lamps 44, each of which is housed in a gold plated tube 46. To cool lamp head 40 during use, water is circulated through the head in the spaces between tubes 46. The details of the design and construction of such lamp heads can be found elsewhere and thus will not be presented here. Refer, for example, to U.S. Pat. No. 5,155,336 to Chris Gronet et al., entitled "Rapid Thermal Heating Apparatus and Method", incorporated herein by reference.

Adapter plate 42 performs multiple functions. It provides a window through which the high intensity radiation light from lamp head 40 can pass into the chamber. It functions as a vacuum barrier between lamp head 40, which is at atmospheric pressure, and the inside of chamber 12, which is typically brought to low pressure or vacuum conditions at some point during the process. It also provides structural support for the window material thus enabling one to use relatively thin material without risk of it breaking under the forces caused having atmospheric pressure on one side of the window and a low pressure or vacuum on the other side. This is especially important for the larger systems that are now being considered for processing substrates that are 300 mm and larger. Finally, it also functions as a showerhead through which gases, e.g. process and/or reactive gases, are injected into the chamber during processing.

Inside cavity 14 there is a support ring 18 which holds substrate 16. Support ring 18 is annular shaped and includes an inwardly extending lip 24 which holds substrate 16 at its outer perimeter thereby leaving most of the substrate's backside exposed. The transition from the lip 24 to the outer portion of support ring 18 defines a shoulder which holds the substrate in place as support ring 24 and tube 20 are rotated during processing.

Beneath substrate 16 there is a reflector plate 28 which is mounted on a water-cooled, stainless steel base 31. Reflector plate 28 is made of aluminum and is coated with a highly reflective material, e.g. gold. Support ring 18 holds substrate about 0.5 inch above a bottom reflecting plate 28 to form a reflecting cavity 35 between the underside of substrate 16 and the top of reflector plate 28. Passing up through the bottom of the chamber are one or more light pipes 30 which are used to sample the radiation within reflecting cavity 35. The sampled radiation from each light pipe is passed through a corresponding optical fiber 32 to one or more pyrometers 34 which convert the intensity of the sampled radiation to a substrate temperature reading. Reflecting cavity 35 serves to enhance the effective emissivity of the substrate and thereby produce more accurate temperature measurements which are less sensitive to variations in emissivity from one wafer to the next. Control circuitry (not shown), which receives the temperature readings from pyrometers 34, regulates the power to lamp head 40 to achieve the desired substrate temperature during the processing cycle.

Support ring 18 rests on top of a rotatable tubular quartz cylinder 20 which is rotated by a magnetically coupled drive mechanism 22 (see FIG. 2) coupled to the bottom of cylinder 20. Cylinder 20 is coated with silicon to render it opaque in the frequency range of the pyrometers. The silicon coating on the quartz cylinder acts as a baffle to block out radiation from external sources that might contaminate the intensity measurements.

Figure 2:
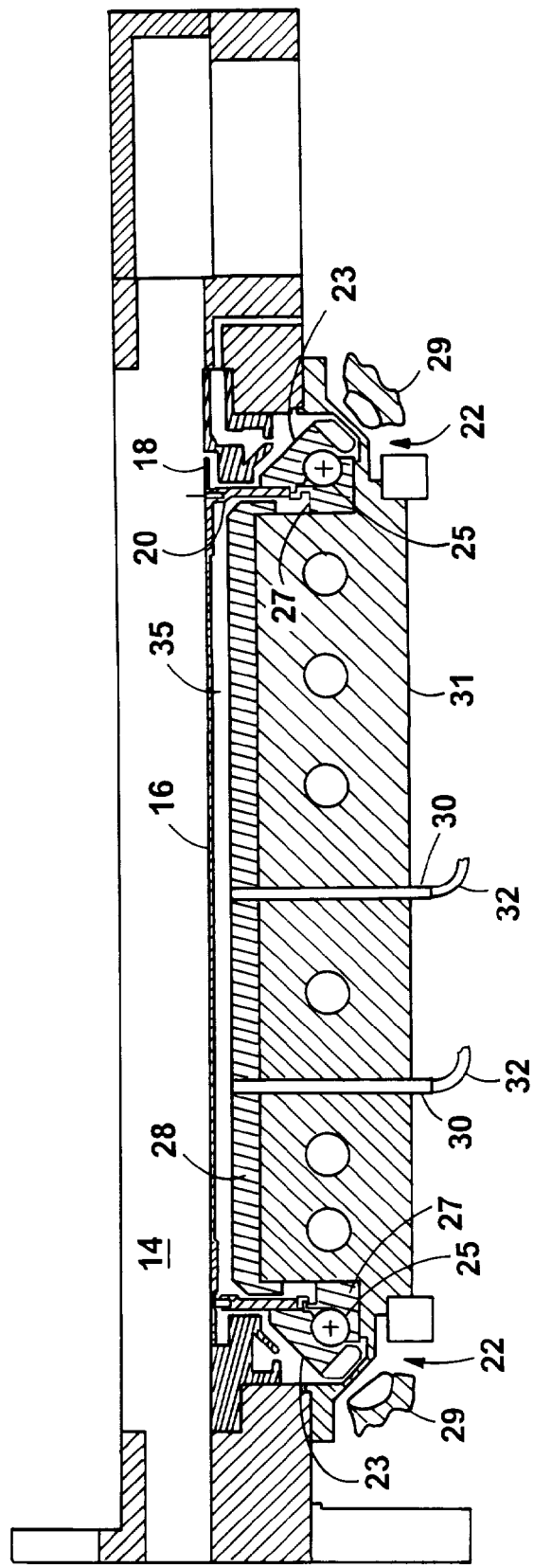
FIG. 2 is a schematic representation of an RTP chamber showing the components of a magnetic drive for rotating the support ring and the substrate.

The magnetic drive mechanism, an example of which is illustrated in FIG. 2, includes an annular upper bearing race 23 which rests on a plurality of ball bearings 25 that are, in turn, held within an stationary, annular, lower bearing race 27. The ball bearings 25 are made of steel and coated with silicon nitride (or alternatively, sold silicon nitride) to reduce particulate formation during operation. The bottom of the quartz cylinder is held by upper bearing race 23 which is magnetically-coupled to an actuator 29 which rotates cylinder 20, support ring 18 and substrate 16, e.g. at about 90 RPM or faster, during thermal processing.

Further details on the system shown in FIG. 2, can be found in U.S. patent application Ser. No. 08/359,302, filed Dec. 19, 1994 entitled "A Method and Apparatus for Measuring Substrate Temperatures", incorporated herein by reference.

Figure 3:
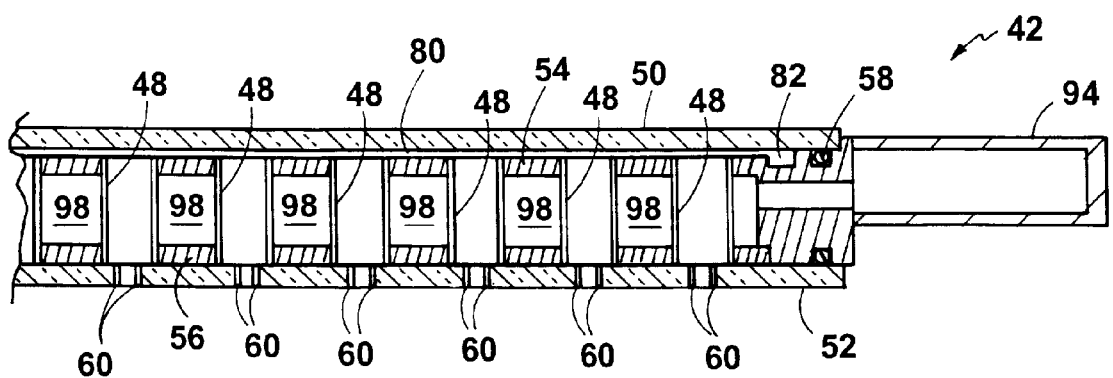
FIG. 3 is a side, cross sectional view of the adapter plate.

Referring to FIGS. 1 and 3, adapter plate 42 is made up of a plurality of hollow tubes 48 sandwiched between two quartz windows, namely, a top window 50 and a bottom window 52. Tubes 48 of adapter plate 42 align with tubes 46 in lamp head 40 when the two units are mounted on top of chamber 12. Tubes 48 are held at the top and bottom ends by a top plate 54 and a bottom plate 56, respectively, both of which are made of metal, e.g. stainless steel. Top and bottom plates 54 and 56 have an identical array of holes in them. Each of the holes is slightly larger than the outside diameter of the tube. The ends of each tube rest in corresponding holes of the top and bottom plates and are welded in place.

Both top window 50 and bottom window 52, which rest against top and bottom plates 54 and 56, respectively, are made of a material that is transparent to the wavelength of the radiation that is emitted by the lamps (e.g. quartz). Around the perimeter of top plate 54, there is a groove with an O'ring 58 that forms a vacuum seal between top window 50 and top plate 54. Similarly, around the perimeter of bottom plate 56, there is another groove with another O'ring 52 that forms a vacuum seal between bottom window 52 and bottom plate 56. Top window 50 provides a vacuum barrier between the lamp head which is at atmospheric pressure and the inside of the adapter plate, which is typically at reduced pressure during processing (e.g. a pressure that is higher than the chamber pressure but lower than atmospheric). In contrast, bottom plate 52 includes an array of holes 60 which are clustered in locations adjacent to tubes 48. Thus, gas which is injected into adapter plate 42 passes out through these holes into the chamber.

Figure 4:
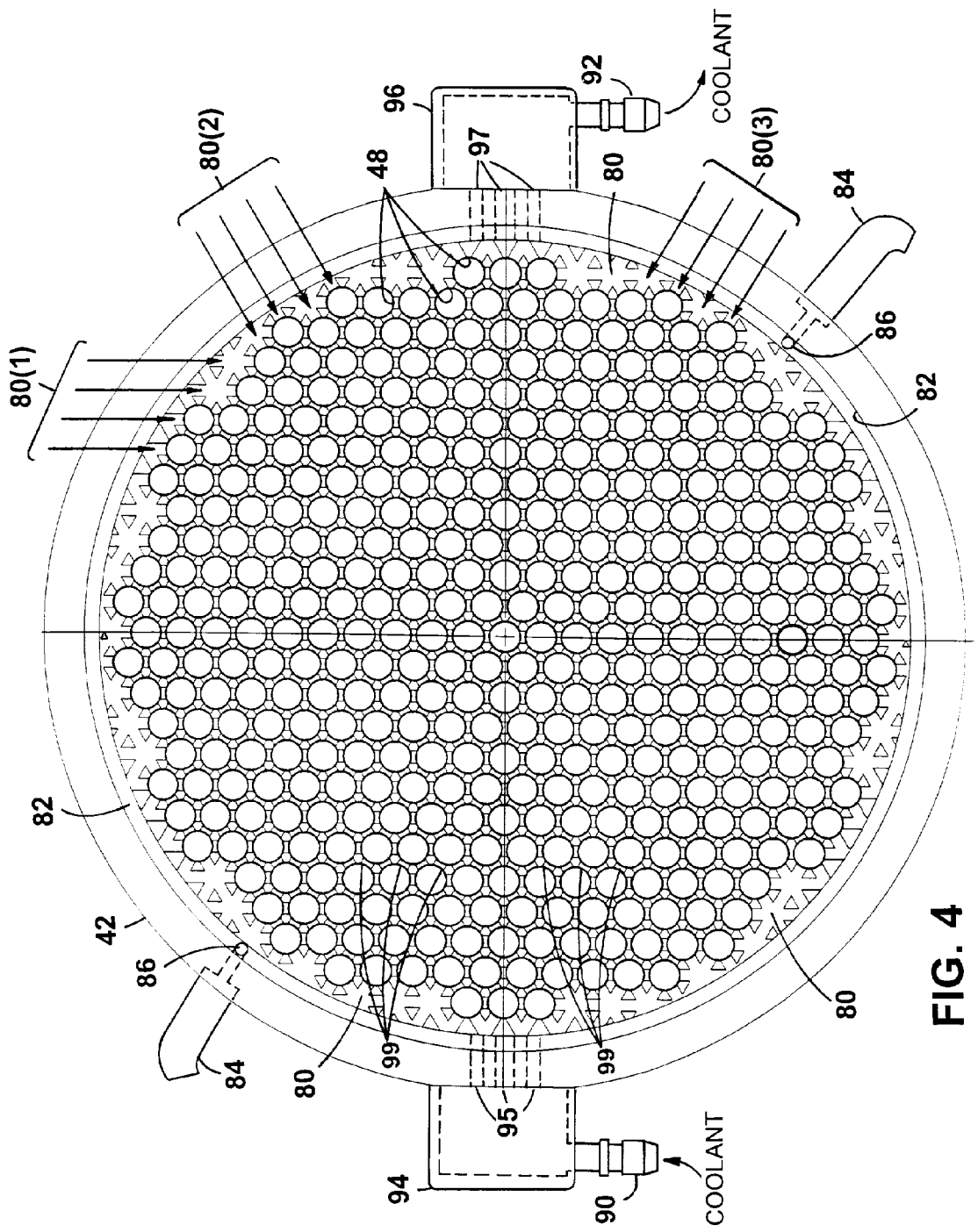
FIG. 4 is a top view of the adapter plate.

FIG. 4 shows a top view of adapter plate 42 as seen from the perspective of lamp head 40. Across the top of top plate 54 there is a crisscrossing, hexagonal array of milled channels 80. In this described embodiment, the crisscrossing array of channels is formed by milling three separate grids of channels across the plate, each grid made up of parallel milled channels equally spaced across the surface of plate 54. Each grid of milled channels is rotated with respect to the other grid by 120°. In FIG. 4, the three separate grids of milled channels are identified by numerals 80(1), 80(2) and 80(3).

In top plate 54, the holes which receive tubes 48 are centered on the points of intersection of the milled channels of the three different grids. Thus, for each tube 48 there are six milled passageways radiating radially out from the tube and connecting it to the six nearest neighbor tubes.

Around the perimeter of top plate 54 there is also a gas supply groove 82 into which all of the milled channels terminate at either end. Gas is supplied to gas supply groove 82 through a gas coupling 84 which is connected to groove 82 through a passageway 86. The gas that is supplied to gas supply groove 82 flows through the milled channels on top of to plate 54 and into tubes 48. The gas within tubes 48 then flows out of the adapter plate through the holes in bottom window 52.

Generally, it may be desirable to have the distribution of holes in bottom window 52 extend out past the edge of the substrate so as to better approximate a uniform gas distribution. What remains of the process gas, after it passes over the substrate, is then collected by the vacuum system through exhaust ports 71 located near the periphery of the chamber. It may also be desirable to locate the exhaust ports to the side of and below the substrate, as shown, so as to facilitate achieving a more uniform gas distribution over the surface of the substrate. In addition, it is also desirable to utilize an axis-symmetric exhaust system design, i.e., exhaust ports distributed around the perimeter of the substrate and to thereby avoid or minimize any angular dependencies in the gas flow.

In the described embodiment, substrate 16 is about 1 inch below the bottom quartz window of adapter plate 42. When irradiated with high intensity light, substrate 16 will radiate energy back at the adapter plate 42. The radiated energy will typically have a longer wavelength than the wavelength of the impinging light. Thus, the radiated energy will be absorbed to a greater extent by the quartz and it will heat up adapter plate 42. To remove this heat, adapter plate 42 is provided with a liquid coolant system. On one side of adapter plate 42 there is a coolant inlet connector 90 and on the other side there is a coolant outlet connector 92. Coolant (e.g. water) is flowed in through connector 90 into a receiving chamber 94 which is coupled to the space 98 between the tubes through three passageways 95. The water, which circulates between the top and bottom plates 54 and 56 and around the outside of tubes 48, cools both tubes 48 and the top and bottom plates 54 and 56. After the water has passed through adapter plate 42 it exits through three passageways 97 on the opposite side, into a chamber 96, and then out through outlet connector 92.

It may be desirable to include baffles 99 within adapter plate 42 to control the path of the coolant through the inside of adapter plate. The baffles may be complete or partial barriers blocking the passageway between selected neighboring tubes 48. Six such baffles 99 are shown in FIG. 4 for illustrative purposes. The location of such baffles would of course be selected to produce the most effective cooling of the adapter plate.

During operation, process gas is introduced into adapter plate 42 through gas coupling 84. It flows into supply groove 82 around the perimeter of top plate 54 and into the distribution channels crisscrossing top plate 54. From the distribution channels, it flows into the tubes of the array and then to the distribution holes in bottom window 52. The gas flows out of the distribution holes into the chamber above the substrate that is held in the support ring.

The described method of distributing gas to the holes in the bottom window of the adapter plate is, of course, an implementation detail. The described embodiment is meant to merely be illustrative of one of many possible alternative approaches which could be used. For example, if milled channels are used to distribute the gas, the channels could be milled into the bottom surface of bottom plate 56 (i.e., the surface which is contact with bottom window 52). In that case, it would not be necessary to cluster the gas distribution holes in bottom window 52 within areas the are circumscribed by tubes 48. Alternatively, other plumbing arrangements could be used to deliver the gas to the backside of the bottom window. Though with any approach it is desirable to minimize obstructions to the light passing through the adapter plate into the chamber. Also, in general, it is probably desirable to design the adapter plate so that the conductance of the passages delivering gas to the faceplate much higher that the total conductance of holes through the faceplate. In that case, the number, size, and distribution of holes will have less impact on the flow rates through the holes near the center region of the bottom window.

Also, it may be desirable to vary the sizes of the holes and their distribution in ways that are known to persons skilled in the art so as to adjust and/or tailor the flow of process gas over the surface of the substrate. It may also be desirable to inject the gas at several places around the perimeter of the adapter plate. For example, in FIG. 4, two injection points are illustrated on opposite sides of the adapter plate from each other. This will assure a greater uniformity of the conductance of the gas that is supplied to the distribution holes in bottom window 52. In addition, one could also modify the size of the channels as a function of location or distance from the center of the plate to ensure fresh gas is introduced over the entire wafer surface and to counter possible gas depletion effects.

Figure 5:
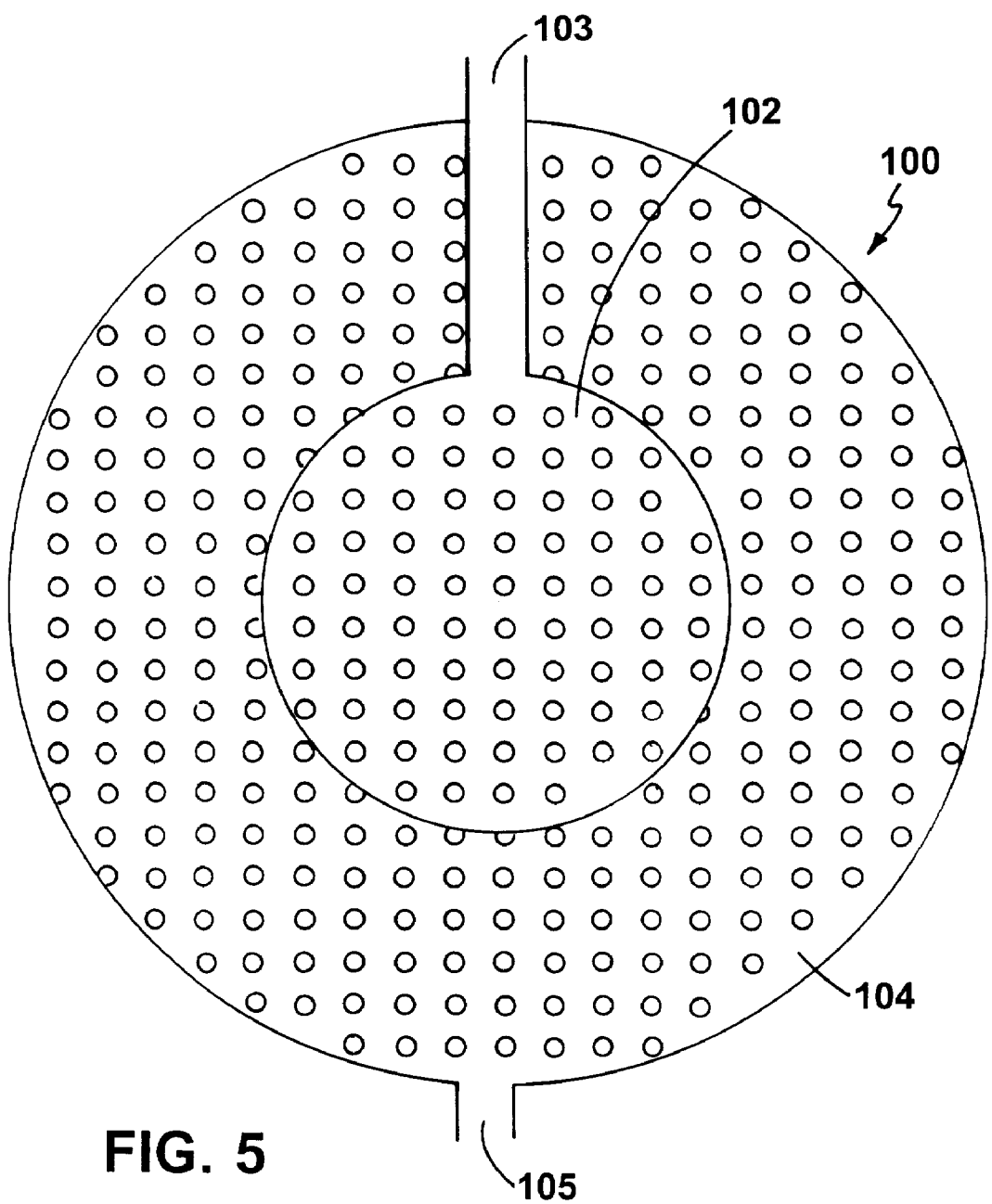
FIG. 5 is bottom view of a multi-zone showerhead.

In the above-described embodiment, gas from a single source is supplied to all of the holes in the bottom window or distribution plate. In other words, all of the tubes 48 and thus all of the gas distribution holes in bottom window 52 are interconnected by the same crisscrossing array of milled channels. Alternatively, the adapter plate can be designed and constructed so as to define two or more sets of independently fed gas distribution hole arrays in bottom window 52. For example, in a dual zone gas showerhead 100 such as is illustrated in FIG. 5, there are two hole arrays, namely, an inner hole array 102 and an outer hole array 104. One source of gas (not shown) feeds gas to the inner hole array 102 through a first inlet port 103 and a second independent source of gas source (not shown) feeds gas to the outer hole array 104 through a second inlet port 105. With this configuration, it is possible to independently control the flow rates through the two gas distribution hole arrays and thereby have greater control over the contour of the gas flow distribution over the surface of the substrate. In addition, by supplying the inner array of gas distribution holes separately from the outer array of gas distribution holes, as illustrated, it becomes possible to modify (e.g. increase) the conductance of the gas delivered to the holes near the center of the showerhead without affecting the conductance of the gas delivered to the holes in the outer array. Conversely, the flow of gas through the holes of the inner array will not be influenced by the number, size, and distribution of holes in the outer array.

A multi-zone showerhead configuration can be implemented in the adapter plate by simply milling the gas distribution channels appropriately. For example, referring to FIG. 6, a dual zone adapter plate showerhead is shown. Note that the water cooling couplings are not shown so as to simplify the drawing. It should be understood, however, that water cooling is also provided in this adapter plate as in the case of the adapter plate shown in FIG. 4.

Figure 6:
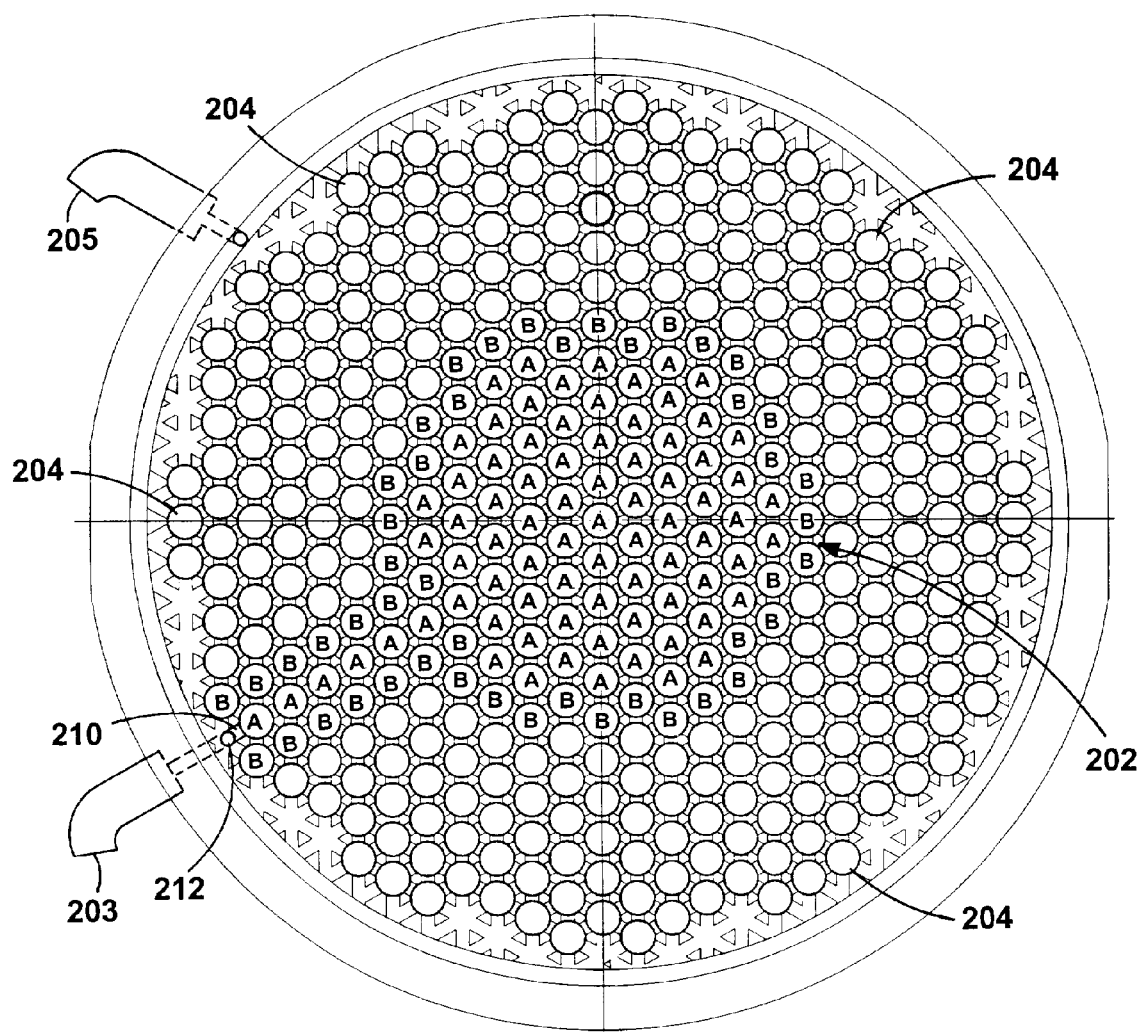
FIG. 6 is an example of an dual-zone adapter plate.

The tubes 48 in the adapter plate of FIG. 6 are divided into two groups, namely, an inner group 202 and an outer group 204. The inner and outer groups 202, 204 of tubes 48 are fed by first and second inlet ports 203, 205, respectively. For clarity, the tubes of the inner group have been labeled with "A" and the tubes of the outer group are either unlabeled or are labeled with "B". The label "B" is used to identify those tubes of the outer group that have at least one inner tube as a nearest neighbor. Recall that in the described embodiment the tubes supply gas to the gas distribution holes that are in bottom window 52.

To isolate the gas supply of the inner tubes from the gas supply of the outer tubes, no milled channels are permitted to pass from a tube opening labeled "B" to a tube opening labeled "A". To get the gas in to the inner tubes, one milled channel 210 extends from a supply hole 212 at the perimeter of the top plate to a tube hole within the inner array of tube holes. In the described embodiment, all of the tube holes through which this milled channel 210 passes also receive gas from this second source. Including gas distribution holes in the bottom window and aligned with the six tubes that lie along a radius extending from the outer perimeter of the top plate to the inner array of tubes is optional.

Of course, alternative approaches can be used to isolate the supplies to the two arrays of holes. For example, sets of channels can be milled in both the top and bottom plates, where one set of channels supplies the inner array and the other set of channels supplies the outer array.

Figure 7A:
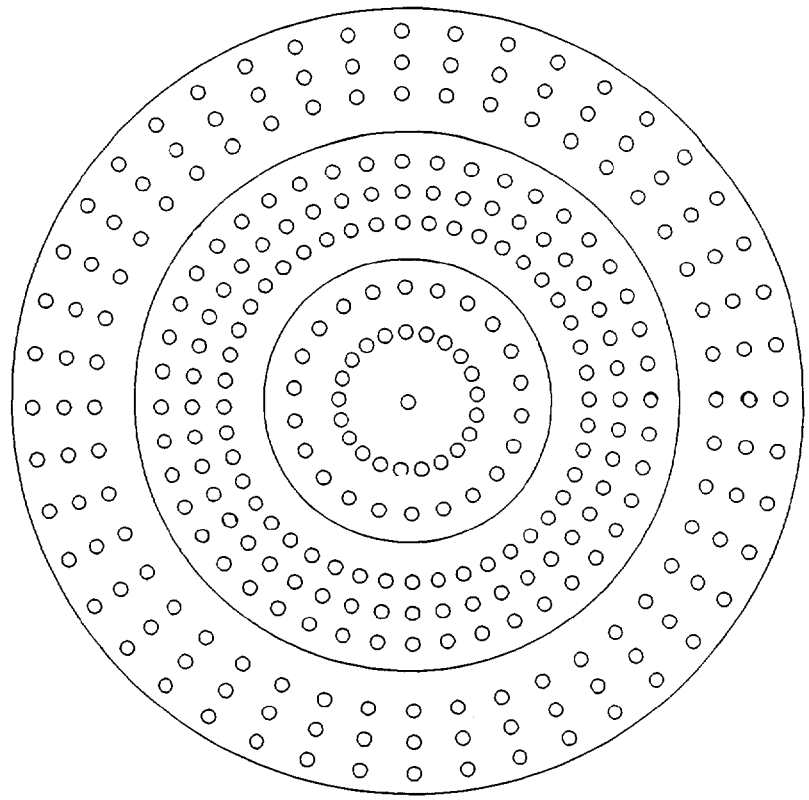
FIGS. 7a and 7b show two examples of other multi-zone showerhead designs.
Figure 7B:
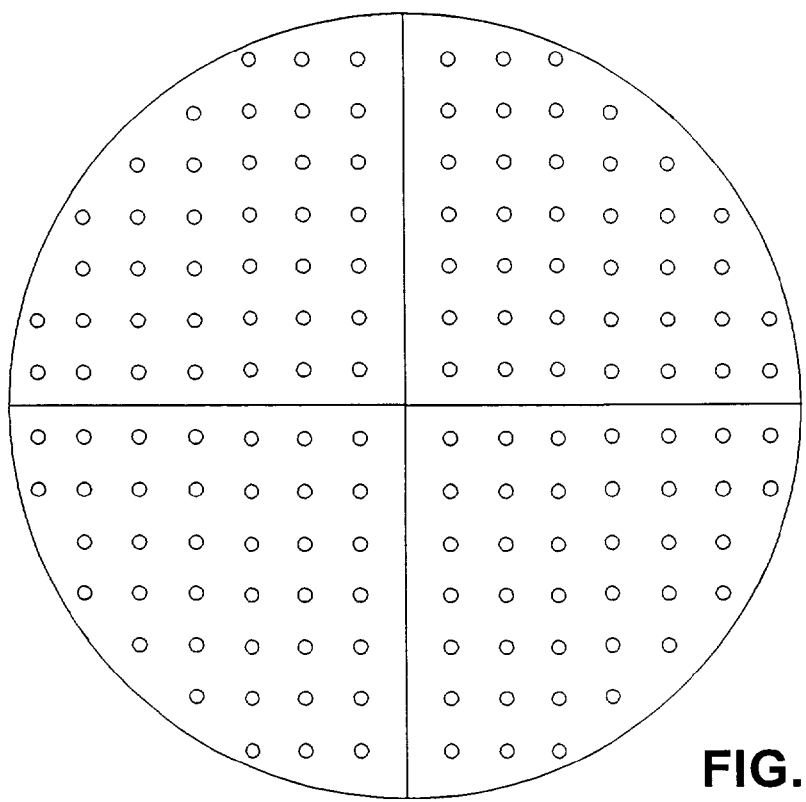

Though we have use a dual-zone showerhead to illustrate this aspect of the invention, it should be understood that more than two zones can be constructed and that the zones can be configured in any shape that produces beneficial or useful results. For example, the showerhead can be divided into pie-shaped segments, with each segment supplied from a different gas source (see FIG. 7*b*). Or there can be multiple concentric zones surrounding a center zone (see FIG. 7*a*). The center zone may consist of a single center gas injection port, in which case the central gas flow component can be controlled independently of the overall gas flow through the showerhead.

The multi-zone showerhead design is generally applicable to systems other than the RTP system described herein. For example, it can be employed in any conventional system which uses a showerhead to introduce process gases into the chamber and regardless of the energy source that is used, e.g. a system that employs an RF generated plasma. In such systems, there is of course no need for the showerhead to be transparent to the high intensity light, as it must be in the case of the RTP system described herein. In such systems, the segmentation of the showerhead can be more complex and there will be fewer constraints on the plumbing that can be used to transport the gases from the different independent sources to the corresponding segments. In contrast, in an RTP system such as is described herein, the adapter plate must be relatively thin and there is typically little to no room behind the plate to add gas supply plumbing. Moreover, any plumbing that is added cannot be allowed to interfere with the transmission of the high intensity radiation through the adapter plate and into the chamber.

Figure 8:
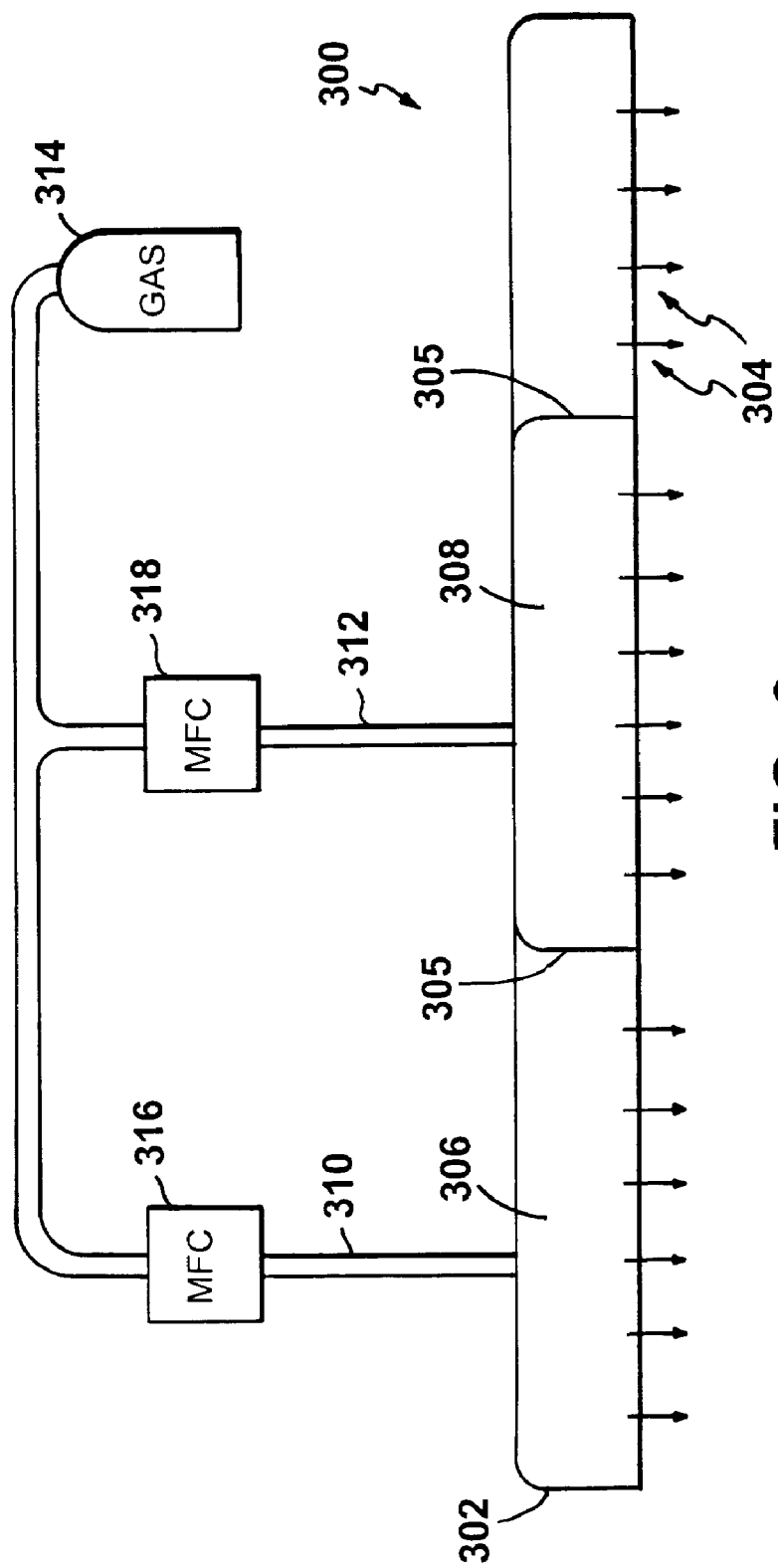
FIG. 8 shows a side, cross-sectional view of a circular showerhead that employs the multi-zone gas flow design.

Referring to FIG. 8, a showerhead 300 such as might be used in an RF plasma etch system or a CVD system includes a hollow metal body 302 (e.g. stainless steel) that includes a faceplate in which there is an array of gas distribution holes 304. This showerhead has a cylindrically-shaped, internal chamber wall 305 that forms two internal chambers, namely, an annular outer chamber 306 and a circular inner chamber 308. Process gas from one source is supplied to outer chamber 306 through one supply line 310 and process gas from another source is supplied to inner chamber 308 through a second supply line 312. In general, the gas delivery systems which are used in this and in the previously described embodiments are constructed from conventional components, well known to persons skilled in the art. In this particular embodiment, the gas delivery system includes a supply of pressurized gas (or gases) 314 and two mass flow controller (MFC's) 316 and 318, one for each supply line 310 and 312, respectively. The MFC's 316 and 318 are programmably controlled through a digital processing unit (not shown).

It should be understood that the inventions described herein can be employed in any substrate processing system which uses a showerhead to distribute process gas to the substrate. This includes, CVD, nitridation, oxidation, etch and cleaning systems, to name a few examples.

Other embodiments are within the following claims.

What is claimed is:

1. A showerhead for introducing gas from one or more external supplies into a substrate processing chamber, said showerhead comprising:

a faceplate including a plurality of gas injection ports through which gas is injected into the chamber, said faceplate being transparent to light, and wherein said plurality of gas injection ports includes a first subset of gas injection ports and a second subset of gas injection ports;

a first gas distribution system which during use delivers a first gas to the first subset of injection ports for injection into the chamber; and a second gas distribution system which is separate from the first gas distribution system and which during use delivers a second gas to the second subset of injection ports for injection into the chamber.

2. The showerhead of claim 1 further comprising:

a plenum chamber formed behind the faceplate and which receives gas from the one or more external supplies, wherein said plenum chamber is divided into a plurality of internal chambers isolated from each other and including a first internal chamber and a second internal chamber; and a first and a second gas inlet, said first inlet coupled to the first chamber and the second inlet coupled to the second chamber.

3. The showerhead of claim 2 for use with a lamp head to heat the substrate to a process temperature, said showerhead further comprising:

a top window on a side of the showerhead that is adjacent to the lamp head; and a bottom window on a side of the showerhead that is adjacent to the substrate during processing, said top and bottom windows defining a cavity therebetween; and wherein the top and bottom windows are transparent to the radiation from the source in the lamp head and wherein the bottom window is said faceplate.

4. The showerhead of claim 3, wherein said plurality of injection ports are a plurality of holes through the bottom window.

5. The showerhead of claim 4, further comprising:

a top plate with a plurality of holes;

a bottom plate with a plurality of holes equal in number to the plurality of holes in the top plate; and a plurality of tubes equal in number to the plurality of holes in the top plate, each of said plurality of tubes connecting a different one of the holes in the top plate to a corresponding one of the holes in the bottom plate; wherein the top window is adjacent to the top plate and the bottom window is adjacent to the bottom plate.

6. The showerhead of claim 4, further comprising:

a top plate with a plurality of holes;

a bottom plate with a plurality of holes equal in number to the plurality of holes in the top plate; and a plurality of tubes equal in number to the plurality of holes in the top plate, each of said plurality of tubes connecting a different one of the holes in the top plate to a corresponding one of the holes in the bottom plate; wherein at least one of said top and bottom plates has a first array of channels formed therein for distributing gas to the first subset of injection ports, and wherein at least one of said top and bottom plates has a second array of channels formed therein for distributing gas to the second set of injection ports.

7. The showerhead of claim 1, wherein said first and second subset of injection ports form a multi-zone arrangement.

8. The showerhead of claim 7, wherein first and second zones are formed by the injection ports of the first and second subsets, respectively, the first zone substantially surrounding the second zone.

9. A thermal processing system comprising:

a chamber defining a processing cavity;

a lamp head;

a showerhead positioned between the lamp head and the processing cavity in the chamber; and a substrate support mechanism for holding a substrate within the chamber, wherein said showerhead is positioned between the lamp head and the substrate that is heated by the lamp head during processing and comprises:

a faceplate including a plurality of gas injection ports through which gas is injected into the chamber, said faceplate being transparent to light from said lamp head, and wherein said plurality of gas injection ports includes a first subset of gas injection ports and a second subset of gas injection ports;

a first gas distribution system which during use delivers a first gas to the first subset of injection ports for injection into the chamber; and a second gas distribution system which is separate from the first gas distribution system and which during use delivers a second gas to the second subset of injection ports for injection into the chamber.

10. The thermal processing system of claim 9, wherein the showerhead further comprises:

a plenum chamber formed behind the faceplate and which receives gas from the one or more external supplies, wherein said plenum chamber is divided into a plurality of internal chambers isolated from each other and including a first internal chamber and a second internal chamber; and a first and a second gas inlet, said first inlet coupled to the first chamber and the second inlet coupled to the second chamber.

11. The thermal processing system of claim 9, wherein said showerhead further comprises:

a top window on a side of the showerhead that is adjacent to the lamp head; and a bottom window on a side of the showerhead that is adjacent to the substrate during processing, said top and bottom windows defining a cavity therebetween; and wherein the top and bottom windows are transparent to the radiation from the source in the lamp head and wherein the bottom window is said faceplate.

12. The thermal processing system of claim 9, wherein said plurality of injection ports are a plurality of holes through the bottom window.

13. The thermal processing system of claim 12, wherein said showerhead further comprises:

a top plate with a plurality of holes;

a bottom plate with a plurality of holes equal in number to the plurality of holes in the top plate; and a plurality of tubes equal in number to the plurality of holes in the top plate, each of said plurality of tubes connecting a different one of the holes in the top plate to a corresponding one of the holes in the bottom plate; wherein the top window is adjacent to the top plate and the bottom window is adjacent to the bottom plate.

14. The thermal processing system of claim 12, wherein said showerhead further comprises:

a top plate with a plurality of holes;

a bottom plate with a plurality of holes equal in number to the plurality of holes in the top plate; and a plurality of tubes equal in number to the plurality of holes in the top plate, each of said plurality of tubes connecting a different one of the holes in the top plate to a corresponding one of the holes in the bottom plate;

wherein at least one of said top and bottom plates has a first array of channels formed therein for distributing gas to the first subset of injection ports, and wherein at least one of said top and bottom plates has a second array of channels formed therein for distributing gas to the second set of injection ports.

15. The showerhead of claim 9, wherein said first and second subset of injection ports form a multi-zone arrangement.

16. The showerhead of claim 15, wherein first and second zones are formed by the injection ports of the first and second subsets, respectively, the first zone substantially surrounding the second zone.

* * * * *